(12) United States Patent
Ding

(10) Patent No.: US 11,418,179 B2
(45) Date of Patent: Aug. 16, 2022

(54) CAPACITIVE DIGITAL ISOLATOR CIRCUIT WITH ULTRA-LOW POWER CONSUMPTION BASED ON PULSE-CODING

(71) Applicant: Shanghai ChipAnalog Microelectronics Ltd., Shanghai (CN)

(72) Inventor: Wanxin Ding, Shanghai (CN)

(73) Assignee: SHANGHAI CHIPANALOG MICROELECTRONICS LTD., Shanghai (CN)

( * ) Notice: Subject to any disclaimer, the term of this patent is extended or adjusted under 35 U.S.C. 154(b) by 0 days.

(21) Appl. No.: 17/344,713

(22) Filed: Jun. 10, 2021

(65) Prior Publication Data

US 2022/0077860 A1    Mar. 10, 2022

(30) Foreign Application Priority Data

Sep. 4, 2020 (CN) .......................... 202010918530.X

(51) Int. Cl.
| | | |
|---|---|---|
| *H03K 5/131* | (2014.01) | |
| *H03K 21/02* | (2006.01) | |
| *H03K 21/40* | (2006.01) | |
| *H04L 25/02* | (2006.01) | |
| *H03K 5/135* | (2006.01) | |

(52) U.S. Cl.
CPC ............ *H03K 5/131* (2013.01); *H03K 21/023* (2013.01); *H03K 21/40* (2013.01); *H04L 25/0266* (2013.01); *H03K 5/135* (2013.01)

(58) Field of Classification Search
CPC ...... H03K 5/131; H03K 5/135; H03K 21/023; H03K 21/40; H04L 25/0266

USPC .......................................... 327/100, 113, 114
See application file for complete search history.

(56) References Cited

U.S. PATENT DOCUMENTS

| | | | | | |
|---|---|---|---|---|---|
| 5,444,600 | A | * | 8/1995 | Dobkin ................ | H01L 23/642 29/25.42 |
| 5,533,053 | A | * | 7/1996 | Hershbarger ....... | H04L 25/0266 333/33 |
| 5,870,046 | A | * | 2/1999 | Scott ..................... | H04M 11/06 379/412 |
| 6,124,756 | A | * | 9/2000 | Yaklin ............. | H03K 19/01759 327/564 |
| 6,167,132 | A | * | 12/2000 | Krone .................... | H04M 11/06 379/406.01 |

(Continued)

*Primary Examiner* — William Hernandez
(74) *Attorney, Agent, or Firm* — Kilpatrick Townsend & Stockton LLP

(57) ABSTRACT

A capacitive digital isolator circuit includes: a signal emitting module; a signal receiving module; and a capacitive isolation module. The signal emitting module includes an edge Pulse-Coding modulator circuit, which modulates an input signal to generate a pair of differential modulated signals based on the input signal and transmits the pair of differential modulated signals to the signal receiving module. Each of the pair of differential modulated signals has twelve high-frequency pulses when the input signal has a rising edge and has six high-frequency pulses when the input signal has a falling edge. The signal receiving module includes an ultra-low power consumption high-speed comparator, a timer and a pulse counter. An output signal of the pulse counter has a rising edge when the pulse number of the comparator output signal is larger than nine and a falling edge when the pulse number is equal to or smaller than nine.

9 Claims, 4 Drawing Sheets

(56) References Cited

U.S. PATENT DOCUMENTS

| | | | | |
|---|---|---|---|---|
| 7,110,531 | B2* | 9/2006 | Prendergast | H04B 3/23 379/413.04 |
| 10,097,338 | B1* | 10/2018 | Ng | G05F 1/561 |
| 2003/0091183 | A1* | 5/2003 | Holcombe | H04B 14/026 379/399.01 |
| 2008/0218258 | A1* | 9/2008 | Crawley | H03F 3/45183 330/10 |
| 2009/0295451 | A1* | 12/2009 | Jordanger | H04L 25/4902 327/333 |
| 2013/0264961 | A1* | 10/2013 | Chang | H04B 1/48 315/201 |
| 2014/0328427 | A1* | 11/2014 | Chang | H04L 27/10 375/259 |
| 2016/0056829 | A1* | 2/2016 | Glibbery | H03M 5/12 341/155 |
| 2022/0158873 | A1* | 5/2022 | Hanaoka | H04L 25/0278 |

* cited by examiner

CAPACITIVE DIGITAL ISOLATOR CIRCUIT WITH ULTRA-LOW POWER CONSUMPTION BASED ON PULSE-CODING

PRIORITY CLAIM AND CROSS-REFERENCE

This application claims priority to Chinese patent application No. 202010918530.X, filed Sep. 4, 2020, the disclosure of which is hereby incorporated by reference in its entirety.

TECHNICAL FIELD

The present disclosure relates to the technical field of digital isolator, and more particularly, relates to a capacitive digital isolator circuit with ultra-low power consumption based on Pulse-Coding.

BACKGROUND

Capacitive digital isolators are capacitive isolators using $SiO_2$ as the isolation medium, and have the advantages of being able to be realized by standard CMOS process, high transmission rate, a high isolation withstand voltage, a long operating life, and a low electromagnetic interference (EMI) and so on, and thus become the mainstream isolation techniques in the isolator market. On/Off Key (OOK) modulation technology is widely used in current digital isolator circuits, and has the advantages of high reliability and stability, excellent disturbance resistance and so on. On the other hand, OOK modulation technology has a relatively high quiescent current, which is usually as high as about 1.5 mA per channel, and thus has the disadvantage of an overhigh power consumption. When the input signal has a duty cycle of 50% and a medium or low frequency, the OOK modulation manner will cause the entire system to be at a frequency of the carrier high frequency for half of the working time, which results in relatively large power consumption and a waste of power, and will shorten the standby time of battery-powered systems.

SUMMARY

In general terms, this disclosure is related to a capacitive digital isolator circuit with ultra-low power consumption based on Pulse-Coding.

In one aspect, the capacitive digital isolator circuit with ultra-low power consumption based on Pulse-Coding includes: a signal emitting module having a signal input terminal; a signal receiving module having a signal output terminal; and a capacitive isolation module. The signal emitting module includes an edge Pulse-Coding modulator circuit. The edge Pulse-Coding modulator circuit is configured to modulate an input signal to generate a pair of differential modulated signals based on the input signal and transmit the pair of differential modulated signals to the signal receiving module via the capacitive isolation module. Each of the pair of differential modulated signals has twelve high-frequency pulses when the input signal has a rising edge, whereas each of the pair of differential modulated signals has six high-frequency pulses when the input signal has a falling edge. The signal receiving module includes an ultra-low power consumption high-speed comparator, a timer and a pulse counter. The ultra-low power consumption high-speed comparator is configured to compare the received pair of differential modulated signals to generate a comparator output signal. The pulse counter receives the comparator output signal. The timer is triggered by edges in the comparator output signal and starts timing a first predetermined period. The pulse counter counts a pulse number of the comparator output signal in the first predetermined period. An output signal of the pulse counter has a rising edge when the pulse number of the comparator output signal is larger than nine and a falling edge when the pulse number of the comparator output signal is equal to or smaller than nine.

Further, the signal emitting module further includes a high-frequency pulse generator. The high-frequency pulse generator generates high-frequency pulses and is triggered by the edge Pulse-Coding modulator circuit when the rising edge in the input signal or the falling edge in the input signal is detected by the edge Pulse-Coding modulator circuit. The high-frequency pulse generator automatically shuts down, consuming no quiescent current, after generating the high-frequency pulses.

Further, a working current of the ultra-low power consumption high-speed comparator is adaptive. The working current automatically increases when the pair of differential modulated signals are received. The working current automatically decreases, consuming a low quiescent current, when the pair of differential modulated signals are not received.

Further, the signal emitting module further includes a refresh logic circuit. The refresh logic circuit includes a refresh timer setting a second predetermined period. The refresh logic circuit transmits, at an end of the second predetermined period, a refreshing signal based on a current input signal at the end of the second predetermined period. The refreshing signal includes twelve refreshing high-frequency pulses if the current input signal at the end of the second predetermined period is of a logic high level. The refreshing signal includes six refreshing high-frequency pulses if the current input signal at the end of the second predetermined period is of a logic low level.

Further, the signal emitting module further includes a trigger connected between the signal input terminal of the signal emitting module and the edge Pulse-Coding modulator circuit. The trigger is configured to perform noise shaping for the input signal to generate a square wave.

Further, the signal receiving module further includes a driver connected between an output terminal of the pulse counter and the output terminal of the signal receiving module. The driver is configured to amplify the output signal of the pulse counter.

Further, the capacitive isolation module includes a pair of differential isolation capacitors.

Further, the first predetermined period is 150 nanoseconds.

Further, the second predetermined period is 200 microseconds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting.

Embodiments of the present disclosure will be explained by virtue of specific examples, and those skilled in the art can easily understand other advantages and effects of the present disclosure according to the content disclosed in this specification. Apparently, the described examples are merely a part of the examples of the present disclosure rather than all. The present disclosure can also be implemented or applied by means of other different embodiments, and all details in this specification can also be modified or changed according to different viewpoints and applications without departing from spirits of the present disclosure. It should be noted that the following embodiments and the features therein may be combined with each other in the case of no conflicts.

Based on the present disclosure, those skilled in the art should understand that one aspect described in this disclosure can be implemented independently of any other aspects, and two or more of these aspects can be combined in various ways. For example, a device and/or practical method can be implemented by using any number of aspects elaborated in this disclosure. In addition, other structures and/or functionalities other than one or more of the aspects elaborated in this disclosure may be used to implement this device and/or practical method.

Figure 1:
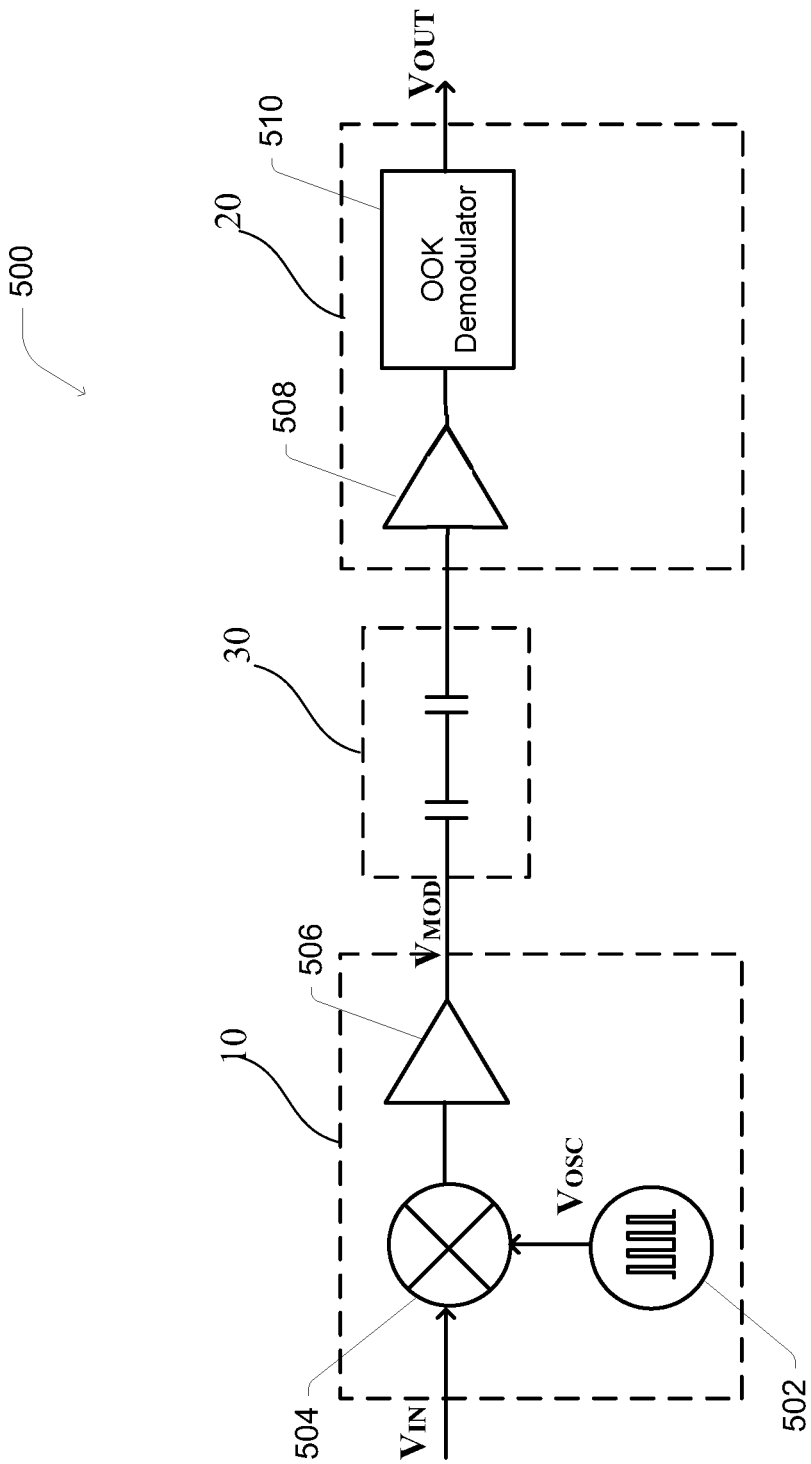
FIG. 1 is a diagram illustrating a structure of a capacitive isolator circuit based on the OOK modulation technology.

Referring to FIG. 1, a capacitive isolator circuit 500 based on OOK modulation technology includes, among other things, three main modules, namely a modulator 10, a demodulator 20 and an isolation capacitor 30. The modulator 10 performs OOK modulation for an input signal $V_{IN}$ and transmits the modulated input signal to the isolation capacitor 30. The demodulator 20 amplifies and demodulates the signal received from the isolation capacitor 30. The isolation capacitor 30 plays a role of providing an isolation between the input signal $V_{IN}$ and the output signal $V_{OUT}$. The modulator 10 may include, among other things, a clock generator 502, an OOK modulator 504 and a driver 506. The clock generator 502 generates high-frequency pulses (also referred to as carriers) $V_{OSC}$ and provides the high-frequency pulses to the OOK modulator 504. The OOK modulator 504 receives both the input signal $V_{IN}$ and the high-frequency pulses $V_{OSC}$, and modulates the low-frequency input signal $V_{IN}$ to a high-frequency OOK modulated signal, which is capable of passing through the isolation capacitor 30. The driver 506 amplifies the high-frequency OOK modulated signal to generate an amplified high-frequency OOK modulated signal $V_{MOD}$ and outputs $V_{MOD}$ to the isolation capacitor 30.

The demodulator 20 includes, among other things, a preamplifier 508 and an OOK demodulator 510. The preamplifier 510 amplifies the small signal that transmits through the isolation capacitor 30. The OOK demodulator 510 demodulates the signal received from the preamplifier 508 and generate the output signal $V_{OUT}$ that has the same waveform as that of the input signal $V_{IN}$. In other words, the OOK demodulator 510 recovers or reconstructs the input signal $V_{IN}$.

Figure 2:
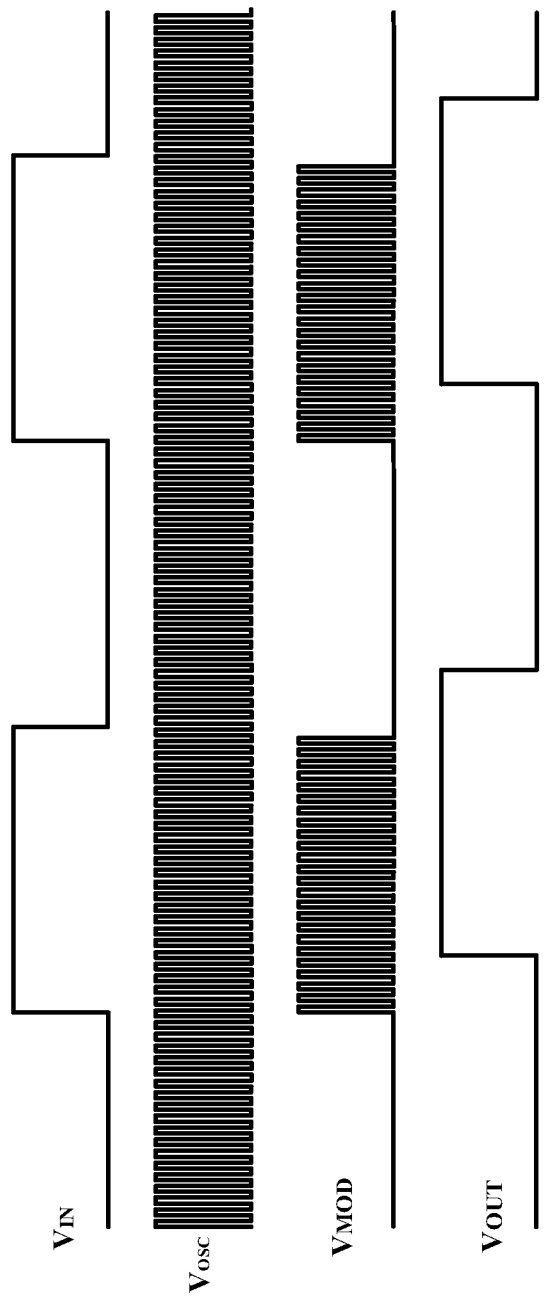
FIG. 2 is a diagram illustrating major waveforms of the capacitive isolator circuit of FIG. 1.

In the example of FIG. 2, $V_{IN}$ is a low-frequency input square signal, whereas $V_{OSC}$ is the high-frequency carrier signal generated by the clock generator 502. $V_{MOD}$ is the amplified high-frequency OOK modulated signal. When $V_{IN}$ has a logical low state (i.e., 0), $V_{MOD}$ has a logical low state as well. When $V_{IN}$ has a logical high state (i.e., 1), $V_{MOD}$ has a square wave form corresponding to $V_{OSC}$ (i.e., having high-frequency pulses with the same frequency as the clock generator 502). The $V_{OUT}$ signal is obtained after $V_{MOD}$ is demodulated by the OOK demodulator 510. The output signal $V_{OUT}$ has the same waveform as the input signal $V_{IN}$. In other words, the output signal $V_{OUT}$ has been reconstructed.

Figure 3:
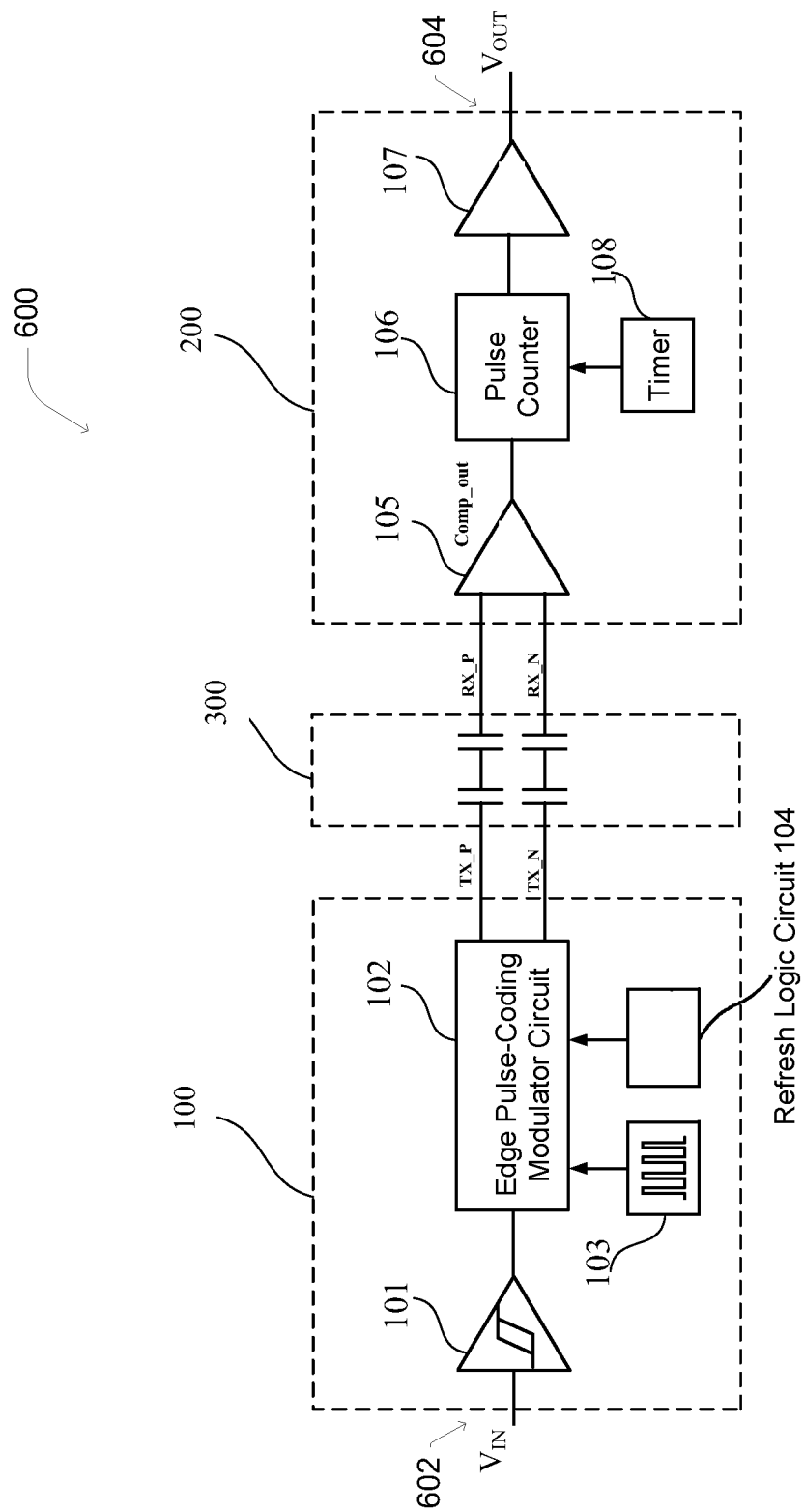
FIG. 3 is a diagram illustrating a structure of a capacitive digital isolator circuit with ultra-low power consumption in accordance with some embodiments.
Figure 4:
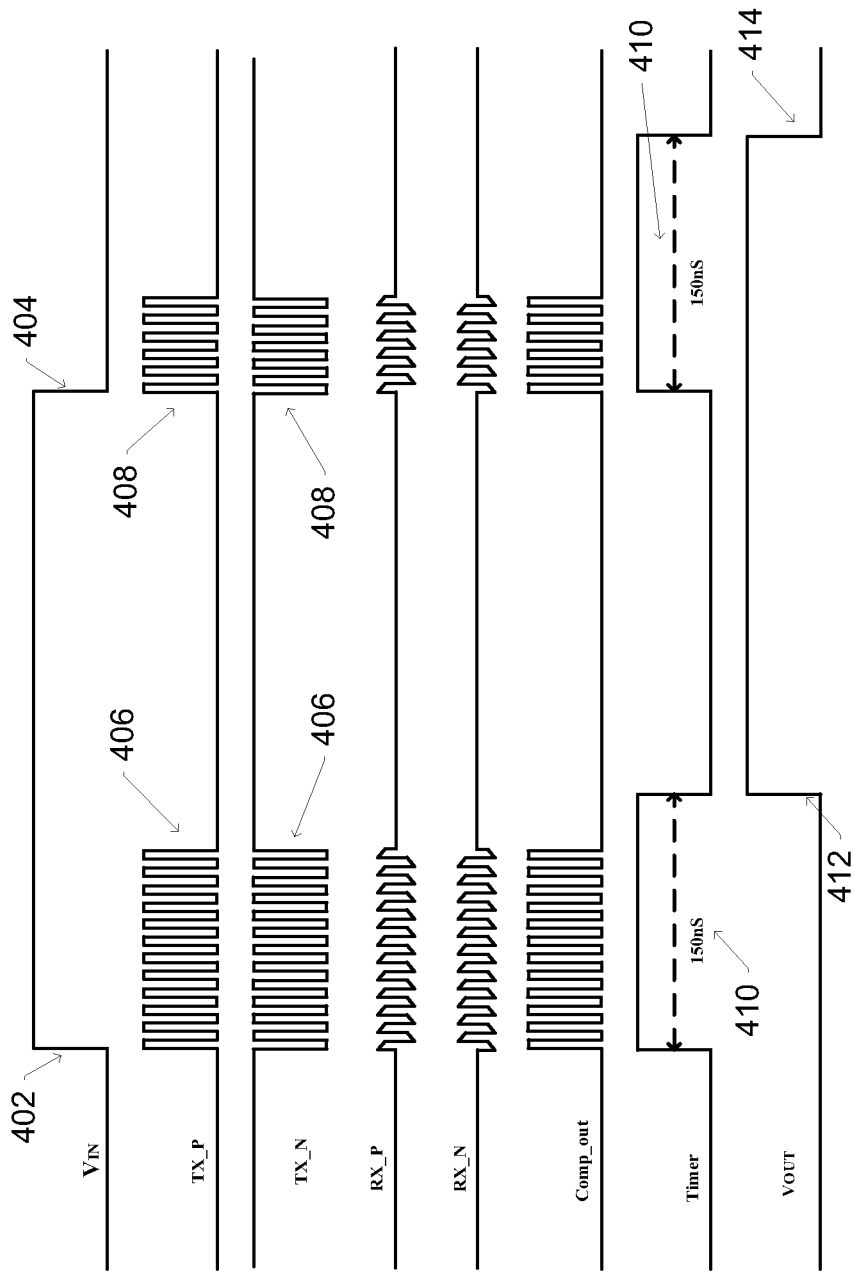
FIG. 4 is a diagram illustrating major waveforms of the capacitive digital isolator circuit of FIG. 3.

In the example of FIG. 3 and FIG. 4, the capacitive digital isolator circuit 600 ultra-low power consumption is based on Pulse-Coding technology. The capacitive digital isolator circuit 600 includes among other things, a signal emitting module 100, a signal receiving module 200, and a capacitive isolation module 300. In one embodiment, the signal emitting module 100 is a signal emitting circuit 100. In one embodiment, the signal receiving module 200 is a signal receiving circuit 200. In one embodiment, the capacitive isolation module 300 is a capacitive isolation circuit 300. The signal emitting module 100 includes, among other things, a trigger 101, a high-frequency pulse generator 103, a refresh logic circuit 104, and an edge Pulse-Coding modulator circuit 102. The trigger 101 is connected between a signal input terminal 602 of the signal emitting module 100 and the edge Pulse-Coding modulator circuit 102, and is configured to perform noise shaping for the input signal $V_{IN}$ to generate a more ideal square wave, as shown in FIG. 4. In one embodiment, the trigger 101 is a Schmitt trigger, which is a comparator circuit with hysteresis implemented by applying positive feedback to the noninverting input of a comparator or differential amplifier.

The edge Pulse-Coding modulator circuit 102 modulates the input signal $V_{IN}$ (after the noise shaping provided by the trigger 101) to generate a pair of differential modulated signals TX_P and TX_N, as shown in FIG. 4, based on the input signal $V_{IN}$. The pair of differential modulated signals TX_P and TX_N are then transmitted to the signal receiving module 200 via the capacitive isolation module 300.

The high-frequency pulse generator 103 is triggered by the edge Pulse-Coding modulator circuit 102 when a rising edge 402 or a falling edge 404 in the input signal $V_{IN}$, as shown in FIG. 4, is detected by the edge Pulse-Coding modulator circuit 102. After being triggered, the high-frequency pulse generator 103 generates high-frequency pulses which are fed to the edge Pulse-Coding modulator circuit 102 as the carrier signal. In one example, the period of each high-frequency pulses is 10 nanoseconds (ns). In other words, the high-frequency is 100 MHz.

In order to directly distinguish the rising edge 402 from the falling edge 404, the edge Pulse-Coding modulator circuit 102 encodes the input signal $V_{IN}$. When the rising edge 402 in the input signal $V_{IN}$ is detected, the edge Pulse-Coding modulator circuit 102 generates a first number of high-frequency pulses 406. In other words, each of the pair of differential modulated signals TX_P and TX_N has the first number of high-frequency pulses 406. In one embodiment, the first number is twelve. On the other hand, when the falling edge 404 in the input signal $V_{IN}$ is detected, the edge Pulse-Coding modulator circuit 102 generates a second number of high-frequency pulses 408. In other words, each of the pair of differential modulated signals TX_P and TX_N has the second number of high-frequency pulses 408. The second number is different from the first number. In one embodiment, the second number is smaller than the first number. In one embodiment, the second number is six.

Moreover, in order to further reduce the power consumption, the high-frequency pulse generator circuit 103 will be triggered and waken up to work only when the rising edge 402 or the falling edge 404 is detected. The high-frequency pulse generator 103 will automatically shut down after generating either the first number of high-frequency pulses 406 or the second number of high-frequency pulses 408, and enter into a sleep state. If the input signal $V_{IN}$ remains to be logical high or logical low for a long time, the high-frequency pulse generator 103 keeps in the sleep state all the time, and consumes no quiescent current, therefore reducing power consumption of the capacitive digital isolator circuit 600.

The capacitive isolation module 300 provides isolation between the signal emitting module 100 and the signal receiving module 200, and therefore between the input signal $V_{IN}$ and the output signal $V_{OUT}$. In one embodiment, the capacitive isolation module 300 includes a pair of differential isolation capacitors. In one embodiment, the pair of differential isolation capacitors have a relatively thick layer of dielectric as the isolation medium, which results in a relatively low capacitance value of the pair of differential isolation capacitors, so as to realize a high isolation withstand voltage. As a result, the pair of differential signals RX_P and RX_N, as shown in FIG. 4, delivered to the signal receiving module 200 via the capacitive isolation module 300 are relatively weak. In one embodiment, the pair of differential isolation capacitors have $SiO_2$ as the isolation medium.

The signal receiving module 200 includes, among other things, an ultra-low power consumption high-speed comparator 105, a pulse counter 106, a driver 107 and a timer 108. In order to realize relatively high-speed signal delivery in the capacitive digital isolator circuit 600, the signal receiving module 200 is required to rapidly and accurately detect, compare, and amplify the received pair of differential signals RX_P and RX_N. The (differential) ultra-low power consumption high-speed comparator 105 can meet this requirement.

The ultra-low power consumption high-speed comparator 105 compares the received pair of differential signals RX_P and RX_N, as shown in FIG. 4, to generate a comparator output signal Comp_out, as shown in FIG. 4. In the example of FIG. 4, the comparator output signal Comp_out is logical high when RX_P is higher than RX_N, and is logical low otherwise.

The pulse counter 106 receives the comparator output signal Comp_out. The timer 108 is triggered when any edge (including any rising edge or falling edge) in the comparator output signal Comp_out is detected, and starts timing to a first predetermined time 410. In one embodiment, the first predetermined period is 150 nanoseconds. During the first predetermined time 410, the pulse counter 106 counts a pulse number of the comparator output signal Comp_out. The output signal of the pulse counter 106 has a rising edge when the pulse number of the comparator output signal Comp_out is larger than a third number, whereas the output signal of the pulse counter 106 has a falling edge when the pulse number of the comparator output signal is equal to or smaller than the third number. In one embodiment, the third number is higher than the second number but smaller than the first number. In this way, there will be a permeable error range of several pulses, which enhances the reliability. In one example, the first number is twelve, the second number is six, and the third number is nine, and the permeable error range is three pulses. In this example, the output signal of the pulse counter 106 has a falling edge when the pulse number of the comparator output signal Comp_out is between three and nine.

The driver 107 is connected between an output terminal of the pulse counter 106 and the output terminal 604 of the signal receiving module 200. The driver 107 is configured to amplify the output signal of the pulse counter 106 to generate the output signal $V_{OUT}$ of the signal receiving module 200. As shown in FIG. 4, the output signal $V_{OUT}$ has a rising edge 412 and a falling edge 414, corresponding to the rising edge 402 and falling edge 404, respectively. As such, the output signal $V_{OUT}$ is reconstructed based on the input signal $V_{IN}$.

Meanwhile, in order to further reduce the power consumption, the timer 108 will be waken up and triggered to work every time only when edges in the comparator output signal Comp_out is detected, and will automatically enter into a sleep state, which consumes no quiescent current, after finishing timing. The afore-mentioned circuit design of the ultra-low power consumption high-speed comparator 105 ensures the low power consumption characteristic of the whole isolator channel. In order to keep detecting the signals, the ultra-low power consumption high-speed comparator 105 has to be in the working state all the time, so the operation current of the ultra-low power consumption high-speed comparator 105 is designed to be adaptive so as to reduce the power consumption. In one implementation, the operation current automatically increases, therefore, the comparing speed can be enhanced, when the pair of differential modulated signals are received, while the operation current automatically decreases, consuming a low quiescent current, when the pair of differential modulated signals are not received. With the low quiescent current, the standby power consumption is only 2 μA. In this way, it is possible to ensure the high-speed comparison performance of the ultra-low power consumption high-speed comparator 105, as well as to reduce power consumption. The pulse counter 106 and the driver 107 are digital circuits without quiescent power consumption.

When the input signal $V_{IN}$ is logical high or logical low for a long time, the signal receiving module 100 cannot detect any edge and will be in the sleep state all the time, and the output signal $V_{OUT}$ might be in an error state all along if an error occurs due to external interference. In order to prevent the output signal $V_{OUT}$ from being in the error state all the time, the state of the input signal $V_{IN}$ needs to be read and "refreshed" at certain intervals (i.e., periodically). The signal emitting module 100 may further include a refresh logic circuit 104. In the refresh logic circuit 104, there is a refresh timer setting a second predetermined period. In one embodiment, the second predetermined period is 200 microseconds (μs). The refresh logic circuit 104 transmits, at an end of the second predetermined period, a refreshing signal based on a current input signal (either logical high or logical low) at the end of the second predetermined period. The refresh logic circuit 104 determines whether the input signal $V_{IN}$ of the signal emitting module 100 is consistent with the output signal $V_{OUT}$ of the signal receiving module 200 and transmits the refreshing signal accordingly.

Specifically, the refreshing signal includes the first number of refreshing high-frequency pulses if the current input signal at the end of the second predetermined period is of a logic high level. As a result, a rising edge could be generated in the output signal $V_{OUT}$. If the output signal $V_{OUT}$ has no error and is still of a logical high level, the logical high level will be remained; if the output signal $V_{OUT}$ has an error and is of a logical low level, the rising edge will make the output signal $V_{OUT}$ return to the logical high level.

On the other hand, the refreshing signal includes the second number of refreshing high-frequency pulses if the current input signal at the end of the second predetermined period is of a logic low level. As a result, a falling edge could be generated in the output signal $V_{OUT}$. If the output signal $V_{OUT}$ has no error and is still of a logical low level, the logical low level will be remained; if the output signal $V_{OUT}$ has an error and is of a logical high level, the falling edge will make the output signal $V_{OUT}$ return to the logical low level. As such, the refresh logic circuit 104 ensures that errors can be corrected in time when the frequency of the input signal $V_{IN}$ is very low, therefore avoiding making mistakes for a long time.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitive digital isolator circuit with ultra-low power consumption based on Pulse-Coding comprising:
    a signal emitting module having a signal input terminal;
    a signal receiving module having a signal output terminal; and
    a capacitive isolation module; wherein:
    the signal emitting module includes an edge Pulse-Coding modulator circuit, the edge Pulse-Coding modulator circuit modulating an input signal to generate a pair of differential modulated signals based on the input signal and transmitting the pair of differential modulated signals to the signal receiving module via the capacitive isolation module, each of the pair of differential modulated signals having twelve high-frequency pulses when the input signal has a rising edge, each of the pair of differential modulated signals having six high-frequency pulses when the input signal has a falling edge; and
    the signal receiving module includes an ultra-low power consumption high-speed comparator, a timer and a pulse counter, the ultra-low power consumption high-speed comparator comparing the received pair of differential modulated signals to generate a comparator output signal, the pulse counter receiving the comparator output signal, wherein the timer is triggered by edges in the comparator output signal and starts timing a first predetermined period, and wherein the pulse counter counts a pulse number of the comparator output signal in the first predetermined period, and wherein an output signal of the pulse counter has a rising edge when the pulse number of the comparator output signal is larger than nine and a falling edge when the pulse number of the comparator output signal is equal to or smaller than nine.

2. The capacitive digital isolator circuit of claim 1, wherein the signal emitting module further includes:
    a high-frequency pulse generator, wherein the high-frequency pulse generator generates high-frequency pulses and is triggered by the edge Pulse-Coding modulator circuit when the rising edge in the input signal or the falling edge in the input signal is detected by the edge Pulse-Coding modulator circuit, and wherein the high-frequency pulse generator automatically shuts down, consuming no quiescent current, after generating the high-frequency pulses.

3. The capacitive digital isolator circuit of claim 1, wherein a working current of the ultra-low power consumption high-speed comparator is adaptive, and wherein the working current automatically increases when the pair of differential modulated signals are received and automatically decreases, consuming a low quiescent current, when the pair of differential modulated signals are not received.

4. The capacitive digital isolator circuit of claim 1, wherein the signal emitting module further includes:
    a refresh logic circuit including a refresh timer setting a second predetermined period, wherein the refresh logic circuit transmits, at an end of the second predetermined period, a refreshing signal based on a current input signal at the end of the second predetermined period;
    wherein the refreshing signal includes twelve refreshing high-frequency pulses if the current input signal at the end of the second predetermined period is of a logic high level; and
    wherein the refreshing signal includes six refreshing high-frequency pulses if the current input signal at the end of the second predetermined period is of a logic low level.

5. The capacitive digital isolator circuit of claim 4, wherein the second predetermined period is 200 microseconds.

6. The capacitive digital isolator circuit of claim 1, wherein the signal emitting module further includes:
    a trigger connected between the signal input terminal of the signal emitting module and the edge Pulse-Coding modulator circuit and configured to perform noise shaping for the input signal to generate a square wave.

7. The capacitive digital isolator circuit of claim 1, wherein the signal receiving module further includes:
    a driver connected between an output terminal of the pulse counter and the output terminal of the signal receiving module and configured to amplify the output signal of the pulse counter.

8. The capacitive digital isolator circuit of claim 1, wherein the capacitive isolation module includes a pair of differential isolation capacitors.

9. The capacitive digital isolator circuit of claim 1, wherein the first predetermined period is 150 nanoseconds.

* * * * *